United States Patent
Lim

(10) Patent No.: US 10,698,609 B2
(45) Date of Patent: Jun. 30, 2020

(54) MEMORY SYSTEM AND OPERATING METHOD OF A MEMORY SYSTEM

(71) Applicant: SK hynix Inc., Icheon-si, Gyeonggi-do (KR)

(72) Inventor: Min Soo Lim, Hwaseong-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/249,332

(22) Filed: Jan. 16, 2019

(65) Prior Publication Data

US 2020/0012436 A1 Jan. 9, 2020

(30) Foreign Application Priority Data

Jul. 3, 2018 (KR) .................. 10-2018-0077311

(51) Int. Cl.
*G06F 12/06* (2006.01)
*G06F 3/06* (2006.01)

(52) U.S. Cl.
CPC .......... *G06F 3/0608* (2013.01); *G06F 3/0659* (2013.01); *G06F 3/0673* (2013.01); *G06F 12/0607* (2013.01)

(58) Field of Classification Search
None
See application file for complete search history.

(56) References Cited

U.S. PATENT DOCUMENTS

| 9,875,785 B2* | 1/2018 | Jose .................... G06F 13/1636 |
| 2004/0015079 A1* | 1/2004 | Berger .................. A61B 8/546 600/437 |
| 2013/0254475 A1* | 9/2013 | Perego ............. G11C 11/40603 711/106 |

FOREIGN PATENT DOCUMENTS

| KR | 100546678 B1 | 1/2006 |
| KR | 100660874 B1 | 12/2006 |
| KR | 101437510 B1 | 9/2014 |

* cited by examiner

*Primary Examiner* — Brian R Peugh
(74) *Attorney, Agent, or Firm* — William Park & Associates Ltd.

(57) ABSTRACT

The present disclosure relates to a memory system and an operating method thereof. The memory system may include a shared memory device to store data, a sharing manager to store operation policy information and to autonomously generate a first internal command by using the operation policy information during an auto mode started in response to receiving an auto mode start command from a host, and a memory controller to generate a second internal command for controlling the shared memory device in response to the first internal command.

22 Claims, 7 Drawing Sheets

MEMORY SYSTEM AND OPERATING METHOD OF A MEMORY SYSTEM

CROSS-REFERENCE TO RELATED APPLICATION

The present application claims priority under 35 U.S.C. § 119(a) to Korean patent application number 10-2018-0077311, filed on Jul. 3, 2018, which is incorporated herein by reference in its entirety.

BACKGROUND

1. Technical Field

Various embodiments of the present teachings relate to a memory system and an operating method of a memory system, and more particularly, to a memory system including a memory controller controlling a shared memory device.

2. Related Art

Random access memory (RAM) is widely used in electronic devices.

Especially, dynamic random access memory (DRAM), which is a type of RAM, is used for its high storage density, high-speed operation, and low cost.

A DRAM cell may include a cell capacitor storing charges corresponding to data. The cell capacitor may be coupled to a bit line through a field effect transistor (FET). A gate of the FET may be coupled to a word line WL.

Before the DRAM cell is read, inherent capacitance of the bit line may be precharged to a predetermined level. To restore data stored in the cell capacitor, the FET may be activated by applying a positive voltage to the word line WL. This operation may cause charge sharing between the cell capacitor and the inherent capacitance. Such charge sharing may change a voltage of the precharged bit line according to the charges stored in the cell capacitor.

In the DRAM cell, an amount of charge stored in the cell capacitor may be reduced over time. For example, when an amount of charge stored in the DRAM cell is reduced to a point at which voltage variations of the bit line cannot be detected, the data stored in the DRAM cell may be lost. Therefore, the DRAM cell needs to be refreshed frequently.

Recently, with the development of artificial intelligence (AI) technologies, big-data processing techniques have been required. Because this data is updated frequently, it is used only once, not multiple times. Thus, although a high memory bandwidth is required for high data processing performance, a memory bandwidth bottleneck may occur due to many data movements. As a result, data processing performance may be degraded.

SUMMARY

Various embodiments are directed to a memory system monitoring a refresh policy managed by a host and autonomously managing a refresh operation on the basis of monitored information, and an operating method thereof.

According to an embodiment, a memory system may include a shared memory device configured to store data; a sharing manager configured to store operation policy information and configured to autonomously generate a first internal command by using the operation policy information during an auto mode started in response to receiving an auto mode start command from a host; and a memory controller configured to generate a second internal command for controlling the shared memory device in response to the first internal command.

According to an embodiment, a memory system may include a shared memory device configured to store data; a sharing manager configured to store operation policy information on a refresh operation, generate a first internal command at a request of a host in a manual mode, and autonomously generate the first internal command by using the operation policy information in an auto mode; and a memory controller configured to generate a second internal command for performing the refresh operation of the shared memory device in response to the first internal command.

According to an embodiment, a method of operating a memory system may include monitoring and storing operation policy information on a refresh operation performed at a request of a host; allowing the memory system to have ownership in response to a request for an auto mode received from the host so that the memory system autonomously performs the refresh operation; and performing the refresh operation on banks included in the shared memory device by using operation policy information for the refresh operation when the memory system has ownership.

DETAILED DESCRIPTION

Example embodiments are described hereinafter with reference to the accompanying drawings. Described embodiments represent different forms but should not be construed as limiting the present teachings. Rather, the described embodiments represent a limited number of possible embodiments.

It will be understood that when an element is referred to as being "coupled" or "connected" to another element, it may be directly coupled or connected to the other element or it may be indirectly coupled or connected to the other element with intervening elements being present therebetween. In the specification, when an element is referred to as "comprising" or "including" a component, it does not preclude the element from including other components unless explicitly indicated otherwise.

Figure 1:
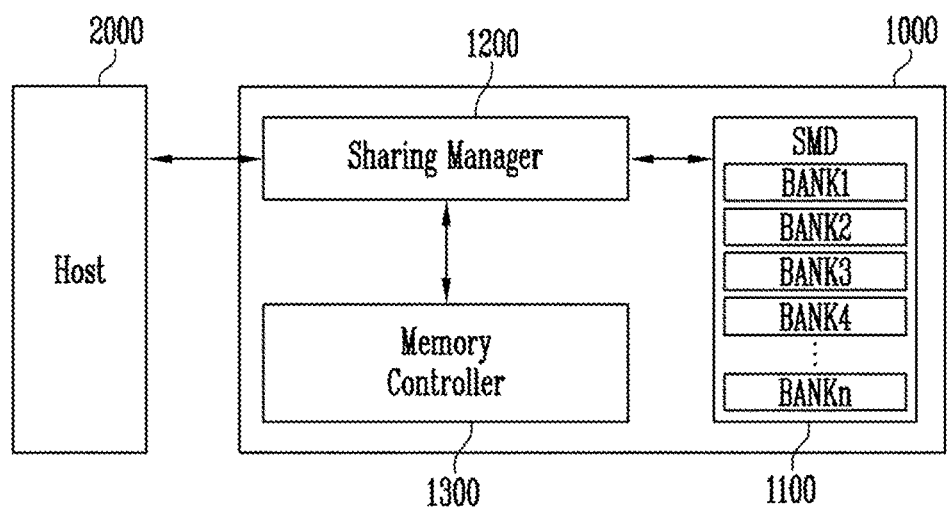
FIG. 1 shows a diagram illustrating a memory system according to an embodiment of the present disclosure.

FIG. 1 shows a diagram illustrating a memory system 1000 according to an embodiment.

Referring to FIG. 1, the memory system 1000 may include a shared memory device (SMD) 1100, a sharing manager 1200 managing the shared memory device 1100, and a memory controller 1300 controlling a program, read, or erase operation.

The shared memory device 1100 may include a plurality of banks (i.e., memory banks) BANK1 to BANKn storing data therein, where n is a positive integer. The banks BANK1 to BANKn may include dynamic random access memory (DRAM) cells in which data are stored. A DRAM cell may lose stored data when a power supply is blocked, and the data stored in the DRAM cell may be gradually lost despite the power supply. Therefore, a refresh operation may be continuously performed so as to maintain the data stored in the DRAM cell.

When receiving a host command from a host 2000, the sharing manager 1200 may communicate with the memory controller 1300 to control the shared memory device 1100. In other words, the sharing manager 1200 may communicate with the host 2000, the memory controller 1300, and the shared memory device 1100. According to an embodiment, the sharing manager 1200 may manage an address of the shared memory device 1100. In addition, the memory system 1000 may manage ownership so as to autonomously manage the shared memory device 1100, monitor operations performed by the shared memory device 1100 at the request of the host 2000, and manage the monitored result. The term 'ownership' may refer to a command for performing a predetermined operation. Ownership may be realized in the form of a signal or a code. The sharing manager 1200 is described with reference to FIG. 3.

The memory controller 1300 may generate and transfer a command for controlling the shared memory device 1100 to the sharing manager 1200 in response to the command received from the sharing manager 1200.

Figure 2:
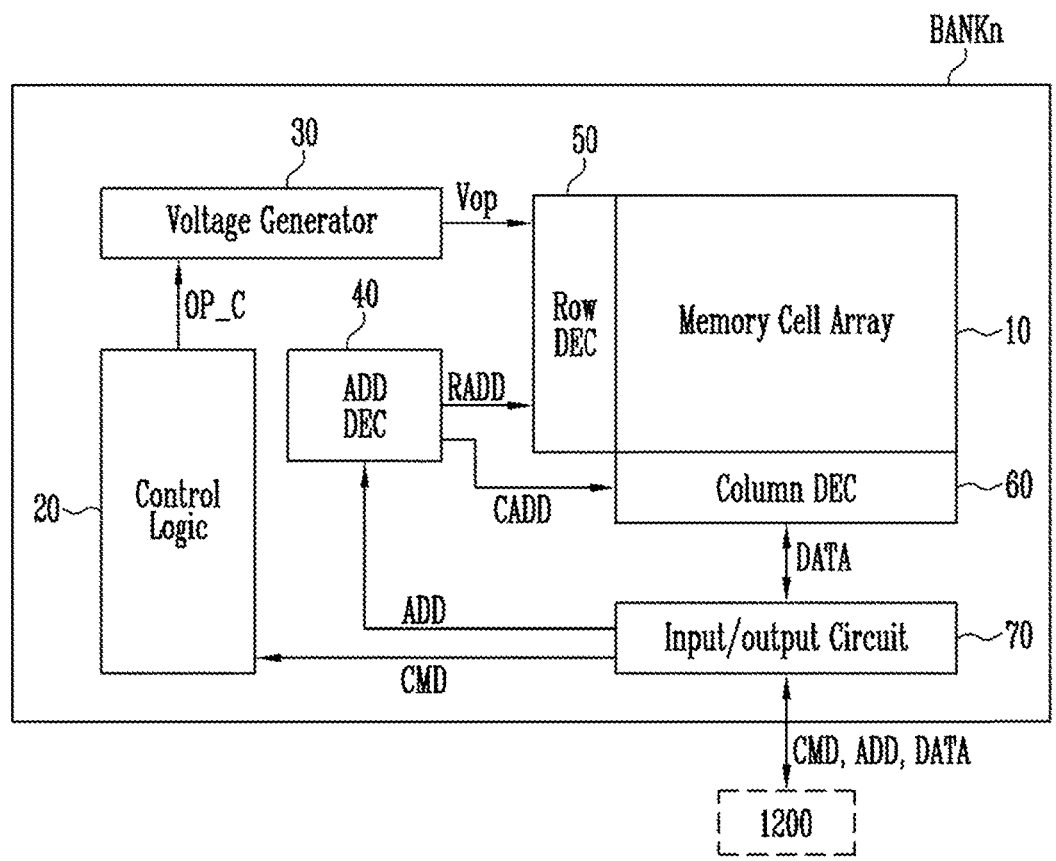
FIG. 2 shows a diagram illustrating a bank of FIG. 1.

FIG. 2 shows a diagram illustrating a bank of FIG. 1.

Because the first to nth banks BANK1 to BANKn have similar configurations to each other, the nth bank BANKn is described below.

Referring to FIG. 2, the nth bank BANKn may include a memory cell array 10 storing data and peripheral circuits 20 to 70 controlling a program, read, erase, or refresh operation on the memory cell array 10.

The memory cell array 10 may include a plurality of DRAM cells.

The peripheral circuits 20 to 70 may include a control logic 20, a voltage generator 30, an address decoder (ADD DEC) 40, a row decoder (Row DEC) 50, a column decoder (Column DEC) 60, and an input/output circuit 70.

The control logic 20 may output an operation code OP_C in response to a command CMD received from the input/output circuit 70. For example, the control logic 20 may output the operation code OP_C to generate a voltage for a program, read, erase, or refresh operation. The control logic may be implemented in hardware, software, or a combination thereof. For example, the control logic may be realized as a control logic circuit operating in accordance with an algorithm.

The voltage generator 30 may generate and output operating voltages Vop for a program, read, erase, or refresh operation in response to the operation code OP_C.

The address decoder 40 may divide the received address ADD into a row address RADD and a column address CADD and output the row address RADD and the column address CADD.

The row decoder 50 may transfer the operating voltages Vop to the memory cell array 10 in response to the row address RADD.

The column decoder 60 may transfer data DATA to the memory cell array 10, or may transfer the data DATA read from the memory cell array 10 to the input/output circuit 70 in response to the column address CADD.

The input/output circuit 70 may receive the command CMD, the address ADD, and the data DATA from the sharing manager 1200, transfer the received command CMD to the control logic 20, and transfer the received address ADD to the address decoder 40. In addition, the input/output circuit 70 may receive the read data DATA from the column decoder 60 and output the data DATA to the sharing manager 1200.

Figure 3:
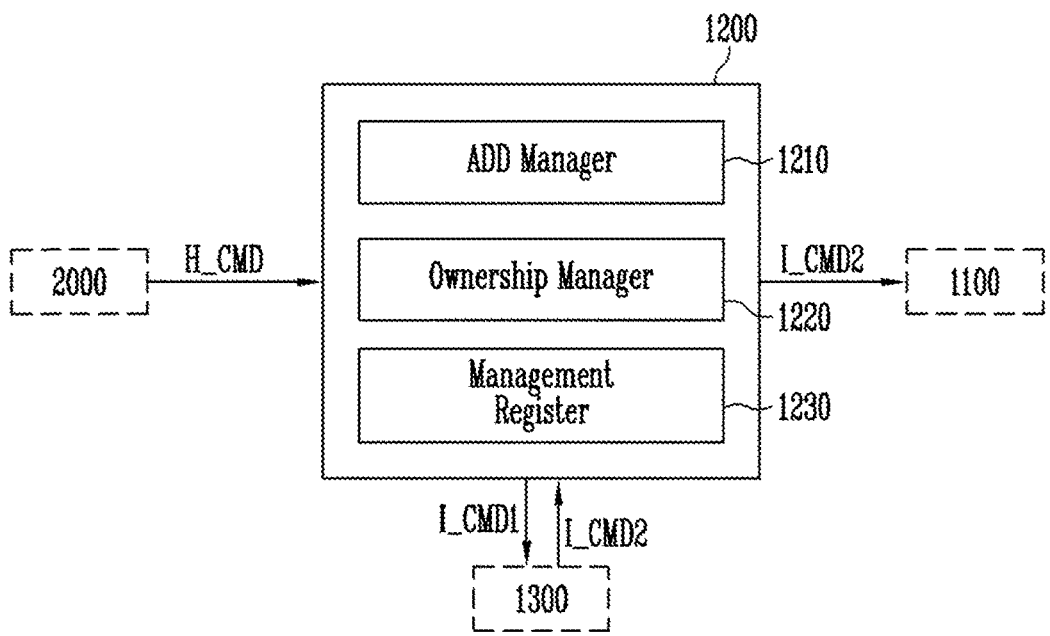
FIG. 3 shows a diagram illustrating a sharing manager of FIG. 1.

FIG. 3 shows a diagram illustrating the sharing manager 1200 shown in FIG. 1.

Referring to FIG. 3, when receiving a host command H_CMD from the host 2000, the sharing manager 1200 may generate and transfer a first internal command I_CMD1 corresponding to the host command H_CMD to the memory controller 1300. In addition, when receiving a second internal command I_CMD2 from the memory controller 1300, the sharing manager 1200 may transfer the second internal command I_CMD2 to the shared memory device 1100. The sharing manager 1200 may communicate with the memory controller 1300 and the shared memory device 1100 in response to control of the host 2000 in a manual mode. However, in an auto mode, the sharing manager 1200 may communicate with the memory controller 1300 and the shared memory device 1100 without intervention of the host 2000. For example, the auto mode may start when an auto mode start command is received from the host 2000, and the auto mode may end when an auto mode end command is received from the host 2000. In the auto mode, the sharing manager 1200 may have ownership for performing an internal operation, and the memory system 1000 may autonomously perform the internal operation according to an operation policy updated in a manual mode while the sharing manager 1200 has ownership. The sharing manager 1200 for performing the above described functions may be configured as indicated below.

The sharing manager 1200 may include an address (ADD) manager 1210, an ownership manager 1220, and a management register 1230.

The address manager 1210 may manage addresses of the banks included in the shared memory device 1100. For example, the address manager 1210 may map an address included in the host command H_CMD received from the host 2000 and the addresses of the banks included in the shared memory device 1100 to each other.

The ownership manager 1220 may have ownership so that the memory system 1000 may perform an operation without intervention of the host 2000. For example, in the manual mode, the ownership manager 1220 may not have ownership. The host 2000 may have ownership when the ownership manager 1220 does not have ownership. When the host 2000 has ownership, the memory system 1000 may operate at the request of the host 2000. In the auto mode, not in the manual mode, the ownership manager 1220 may have ownership instead of the host 2000. Because the ownership manager 1220 has ownership in the auto mode, the ownership manager 1220 may communicate with the memory controller 1300 and the shared memory device 1100 to perform predetermined operations without intervention of the host 2000. For example, when the host command H_CMD received from the host 2000 is an auto mode start command, the ownership manager 1220 may have ownership so as to autonomously control a predetermined operation of the memory system 1000. When the host command H_CMD received from the host 2000 is an auto mode end command, the auto mode may end, and the ownership manager 1220 may return ownership to the host 2000.

The management register 1230 may monitor operations performed at the request of the host 2000, and may update and store policy information about each of the operations. The term 'monitor' may mean detecting information about pages on which the operations requested by the host are performed, temperature information of a bank on which the requested operation is performed, and the like, and storing the detected information. In addition, the term 'monitor' may also mean determining a policy of an operation performed at the request of the host and information about a policy of the performed operation. The management register 1230 may store a plurality of tables and store information about operations performed at the request of the host 2000 in the respective tables. The information stored in the management register 1230 may be updated each time operations are performed at the request of the host 2000.

In addition, the information stored in the management register 1230 may be used when the ownership manager 1220 has ownership, i.e., when the memory system 1000 itself performs an operation. For example, the sharing manager 1200 may generate and transfer the first internal command I_CMD1 to the memory controller 1300 on the basis of the information stored in the management register 1230. The memory controller 1300 may generate and transfer the second internal command I_CMD2 to the sharing manager 1200 in response to the received first internal command I_CMD1. The sharing manager 1200 may transfer the second internal command I_CMD2 to the shared memory device 1100. The shared memory device 1100 may perform an operation in response to the second internal command I_CMD2. The operation performed by the memory system 1000 itself may be a refresh operation of the shared memory device 1100.

A refresh operation may be periodically performed in order to maintain data of a DRAM cell. However, when the host 2000 controls the refresh operation each time, a data bottleneck may occur between the host 2000 and the memory system 1000. For example, in order to control the refresh operation when a large amount of data is to be processed, the amount of data to be processed between the host 2000 and the memory system 1000 may be increased. Therefore, in an embodiment, instead of the host 2000, the sharing manager 1200 may have ownership and control the refresh operation on the basis of the information stored in the management register 1230.

Figure 4:
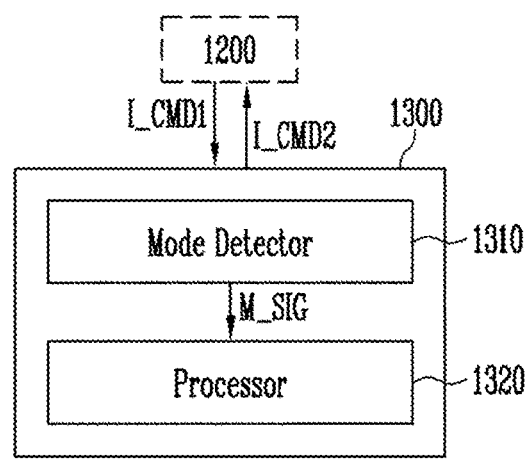
FIG. 4 shows a diagram illustrating a memory controller shown in FIG. 1.

FIG. 4 shows a detailed diagram illustrating the memory controller 1300 shown in FIG. 1.

Referring to FIG. 4, the memory controller 1300 may detect an auto mode or a manual mode, and may generate the second internal command I_CMD2 for performing various operations in response to the first internal command I_CMD1 received from the sharing manager 1200. For example, the memory controller 1300 may detect whether the first internal command I_CMD1 is a command of the auto mode or the manual mode based on the information included in the first internal command I_CMD1. The memory controller 1300 may include a mode detector 1310 and a processor 1320.

For example, the mode detector 1310 may detect whether the first internal command I_CMD1 is a command of the auto mode or the manual mode based on the information included in the first internal command I_CMD1. The mode detector 1310 may output a mode signal M_SIG according to the detected mode. For example, the mode detector 1310 may output the mode signal M_SIG of a low level in the manual mode and the mode signal M_SIG of a high level in the auto mode. Depending on the setup of the memory system 1000, the levels of the mode signal M_SIG may be reversed for different embodiments.

The processor 1320 may generate the second internal command I_CMD2 for performing an internal operation in response to the mode signal M_SIG and the first internal command I_CMD1. The generated second internal command I_CMD2 may be transferred to the sharing manager 1200.

Figure 5:
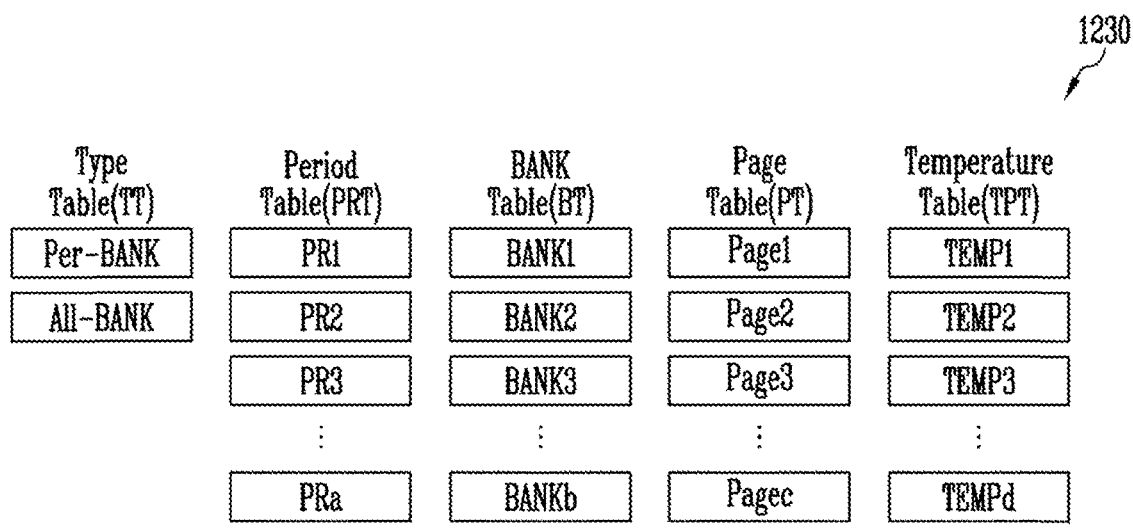
FIG. 5 shows a diagram illustrating an embodiment of information stored in a management register.

FIG. 5 shows a diagram illustrating information stored in the management register 1230 in accordance with an embodiment.

Referring to FIG. 5, the management register 1230 may store and update information about operations performed at the request of the host 2000. The management register 1230 may include at least one table storing operation information. For example, the management register 1230 may include a type table TT, a period table PRT, a bank table BT, a page table PT, and a temperature table TPT for storing various operation information. The tables shown in FIG. 5 correspond to an embodiment presented for convenience of explanation, and the management register 1230 may include various additional or alternate tables storing other operation information.

The type table TT may store operation type policy information of the shared memory device 1100. For example, information about whether a refresh operation is performed according to a per-bank policy (Per-BANK) or an all-bank policy (All-BANK). For example, a refresh operation may be necessarily performed more frequently under the per-bank policy than under the all-bank policy, and a period in which the refresh operation is performed may be stored in the period table PRT.

The period table PRT may store information about periods PR1 to PRa in which the host command H_CMD with respect to the same operation is transferred by the host 2000, where a is a positive integer. For example, a period in which the host command H_CMD for the refresh operation is transferred may be stored. For example, when the host command H_CMD is received during a first period PR1, a first period PR1 value may be stored in the period table PRT, and when the host command H_CMD is received during a second period PR2 longer than the first period PR1, a second period PR2 value may be stored in the period table PRT. In another example, the period table PRT may store a period value which is automatically set according to the per-bank policy and a period value which is automatically set according to the all-bank policy.

The bank table BT may store addresses BANK1 to BANKb of the banks included in the shared memory device 1100, where b is a positive integer. For example, when a refresh operation is performed according to the per-bank policy, addresses of banks on which the refresh operation is performed may be stored in the bank table BT. For example, when the first bank BANK1 is refreshed every first period PR1 according to the per-bank policy, BANK1 may be stored in the bank table, PR1 may be stored in the period table PRT, and per-bank information may be stored in the type table TT. When a refresh operation is performed according to the all-bank policy, a 'null' value may be stored in the bank table BT. In addition, an address of a bank including an open page may be stored in the bank table BT.

The page table PT may store information about activated pages Page1 to Pagec, where c is a positive integer. For example, when the memory system 1000 uses an open page policy, which page is activated should be found. For example, the open page policy may mean that even after a program or read operation is performed on an activated page, the corresponding page may stay activated, so that an activation operation may be skipped when access to the same page is made. However, according to the open page policy, because access to another page is made when the page is activated, pages in a selected bank can be activated or deactivated only with information about the activated page. A selected page may stay open under the open page policy, whereas according to a close page policy, a page should be activated each time access to the page is made. Thus, the memory system 1000 may use the information stored in the page table PT depending on a page policy (open or closed). For example, when an open bank is selected from the bank table BT, addresses of open pages included in the open bank may be automatically allocated among page addresses stored in the page table PT.

The temperature table TPT may store temperature information TEMP1 to TEMPd of the banks, where d is a positive integer. The temperature information stored in the temperature table TPT may be temperature information of the banks. For example, a period in which a refresh operation is performed may vary depending on the temperature information stored in the temperature table TPT.

For some embodiments, the management register 1230 may store other information in addition to or in place of the above table information. The more information the management register 1230 tracks, for example, the more specifically the memory system 1000 may be managed in the auto mode.

Figure 6:
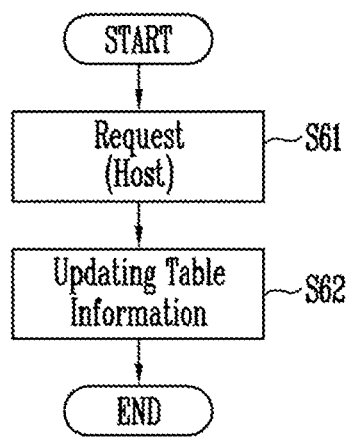
FIG. 6 shows a flowchart illustrating a manual mode according to an embodiment of the present disclosure.

FIG. 6 shows a flowchart illustrating a manual mode according to an embodiment of the present disclosure.

Referring to FIG. 6, in the manual mode, the memory system 1000 may store or update information about operations controlled at the request of the host 2000 and perform a requested operation. For example, the host 2000 may generate and transfer a request for a predetermined operation to the memory system 1000 (S61).

When receiving the request from the host 2000, the memory system 1000 may store information about the operation corresponding to the request of the host 2000 and information about conditions under which the selected operation is performed, and may update any changes in information (S62). The memory system 1000 may perform the operation corresponding to the request of the host.

Figure 7:
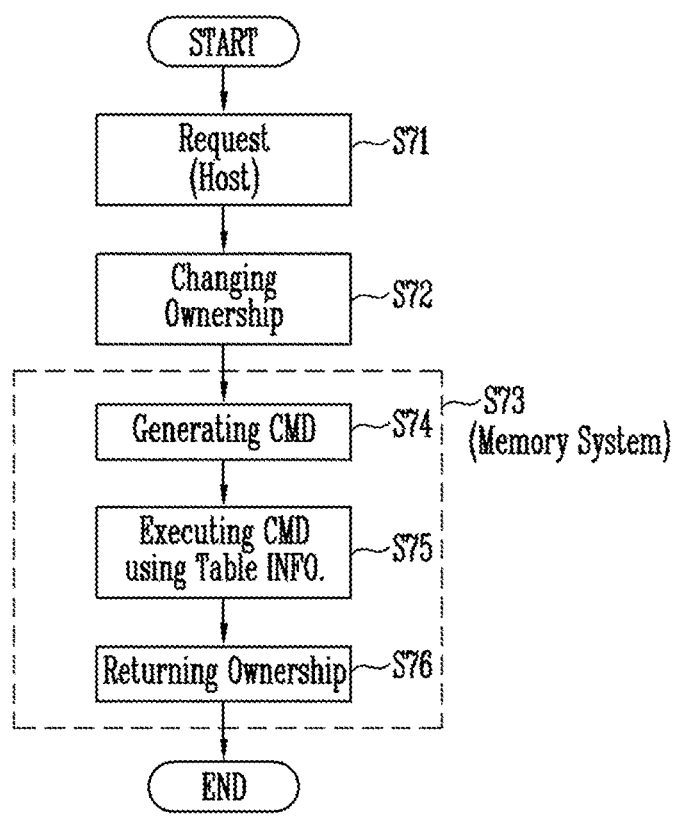
FIG. 7 shows a flowchart illustrating an auto mode according to an embodiment of the present disclosure.

FIG. 7 shows a flowchart illustrating an auto mode according to an embodiment of the present disclosure.

Referring to FIG. 7, in the auto mode, the memory system 1000 may automatically perform a predetermined operation without intervention of the host 2000 on the basis of stored information. For example, the host 2000 may generate a start command for the auto mode for the predetermined operation and transfer the start command to the memory system 1000 (S71).

The memory system 1000 may change ownership to itself in response to the signal for the auto mode (S72).

The memory system 1000 may be operated as the auto mode using the ownership (S73). For example, the memory system 1000 may generate a command for an operation to be performed (S74) and execute the command by using information stored in a table (Table INFO.) (S75). The table used herein may be the tables stored in the management register 1230 of FIG. 5. When an end command with respect to the auto mode is received from the host 2000, the auto mode may end, and the memory system 1000 may return ownership to the host 2000 (S76). In addition, prior to returning ownership to the host 2000, the memory system 1000 may restore the policy operation information to the original state when the auto mode started. The memory system 1000 might not operate when the operation policy of the host 2000 and the operation policy of the memory system 1000 do not coincide with each other. Thus, by returning the operation policy information to the same state as before the auto mode, the host 2000 may be able to control the memory system 1000 in the manual mode.

The memory system 1000 may perform various operations in the auto mode. However, in accordance with an embodiment, a refresh operation is described with reference to FIG. 8.

Figure 8:
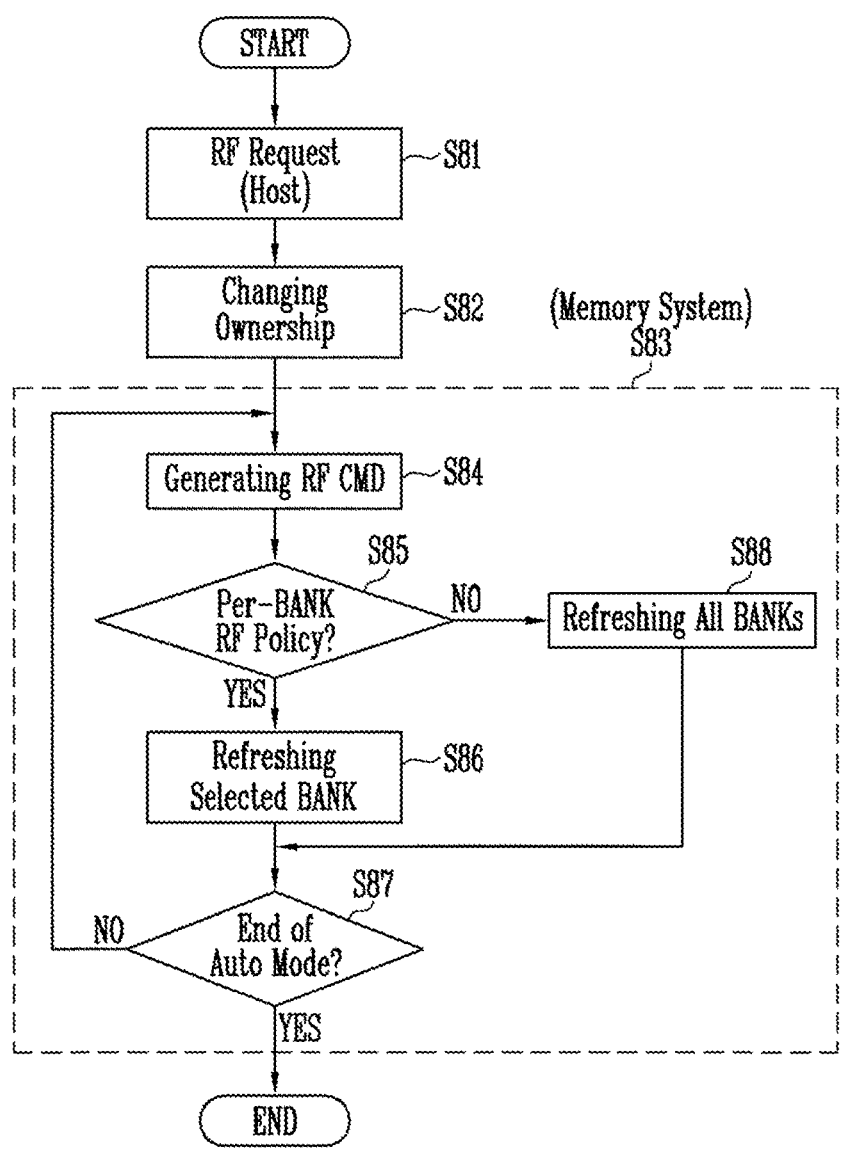
FIG. 8 shows a flowchart illustrating an auto mode according to another embodiment of the present disclosure.

FIG. 8 shows a flowchart illustrating an auto mode according to another embodiment of the present disclosure.

A refresh operation in the auto mode is described with reference to FIG. 8. A host may request a refresh RF operation to a memory system (S81). For example, the host 2000 may transfer an auto mode start command to the memory system 1000.

The memory system 1000 may convert change ownership of the refresh operation to the memory system 1000 in response to the auto mode start command (S82). The memory system 1000 may autonomously perform the refresh operation periodically (S83).

An operation 'S83' is described in more detail. The memory system 1000 may generate a refresh command REF CMD (S84). The memory system 1000 may perform the refresh operation on the basis of the information stored in the management register 1230 of the memory system 1000 as shown in FIG. 5. For example, the memory system 1000 may perform the refresh operation on the basis of the information stored in the tables of the management register 1230 of FIG. 5. For example, referring to the information stored in the type table TT of the management register 1230 as shown in FIG. 5, per-bank information or all-bank information may be stored in the type table TT. In other words, the sharing manager 1200 may determine whether or not the per-bank policy information is stored on the basis of the information stored in the type table TT (S85).

When the memory system 1000 is set such that a refresh operation is performed according to the per-bank policy (YES at S85), a refresh operation of a selected bank may be performed (S86). The refresh operation of the selected bank may be controlled by the processor 1320 of the memory controller as shown in FIG. 4. At 'S85', when the memory system 1000 is set such that the refresh operation is performed according to the all-bank policy (NO at S85), the refresh operation may be performed on all banks (S88).

When the refresh operation (S86 or S88) of the selected bank is terminated, an operation of determining whether the auto mode ends or not may be performed (S87). For example, the memory system 1000 may determine whether an auto mode end command is received from the host 2000, and when the auto mode end command is not received (NO at S87), the auto mode may be maintained and operations may be re-performed starting from 'S84'. When it is determined that the auto mode end command is received from the host 2000 (YES at S87), the memory system 1000 may end the auto mode and return ownership to the host 2000

In FIG. 8, the case in which the type table TT included in the management register 1230 as shown in FIG. 5 is used is described as an embodiment. However, a refresh operation of the memory system 1000 may be performed in an auto mode on the basis of the information stored in various tables included in the management register 1230. In the auto mode, other operations besides the refresh operation may be performed by the memory system 1000.

For example, in the auto mode, the memory system 1000 may keep receiving a request from the host 2000 as well as performing the refresh operation. In other words, the memory system 1000 may perform a refresh operation according to a refresh period stored in the management register 1230 and may perform an operation requested by the host 2000 when the refresh operation is not being performed. Therefore, because the host 2000 may communicate with the memory system 1000 for other operations besides the refresh operation when the refresh operation is performed in the auto mode by the memory system 1000, a data bottleneck phenomenon between the host 2000 and the memory system 1000 may be reduced. In addition, the reduction in the data bottleneck phenomenon may cause a reduction in power consumed by the memory system 1000.

Figure 9:
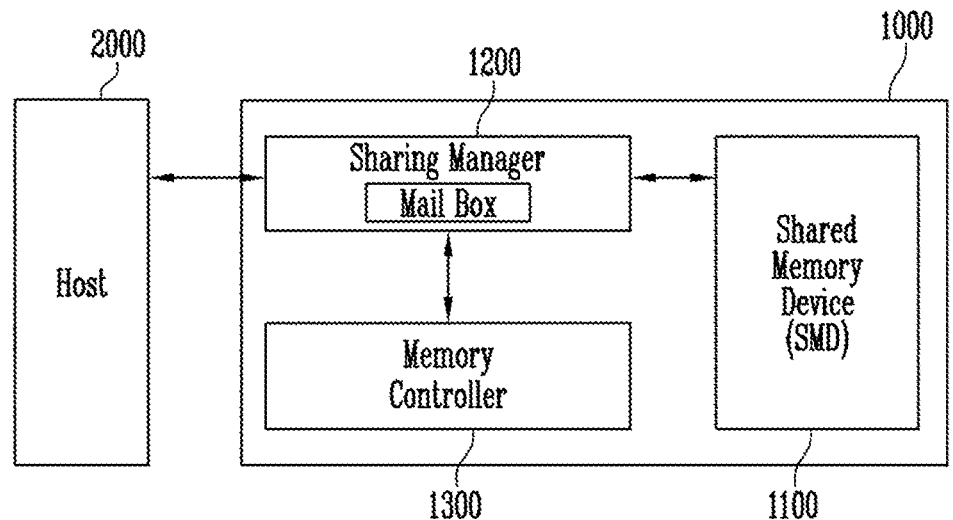
FIG. 9 shows a diagram illustrating a memory system according to another embodiment of the present disclosure.

FIG. 9 shows a diagram illustrating the memory system 1000 according to another embodiment of the present disclosure.

Referring to FIG. 9, the memory system 1000 may include a processing-near-memory (PNM). The memory system 1000 including the PNM may have a similar configuration to the memory system 1000 of FIG. 1. A mail box may be included in the sharing manager 1200. The memory system 1000 as shown in FIG. 9 may control operations performed in an auto mode by using information stored in the mail box.

Figure 10:
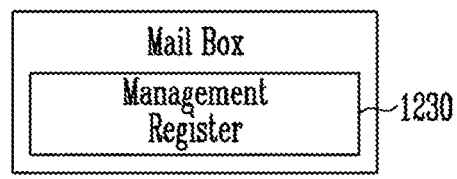
FIG. 10 shows a diagram illustrating a mail box of FIG. 9.

FIG. 10 shows a diagram illustrating the mail box of FIG. 9.

Referring to FIG. 10, the mail box may include the management register 1230, and the management register 1230 may store various information as shown in FIG. 5. The mail box may be a buffer which stores data frequently used in an electronic device or temporarily stores data. In this embodiment, the above-described mail box may serve as the management register 1230.

Figure 11:
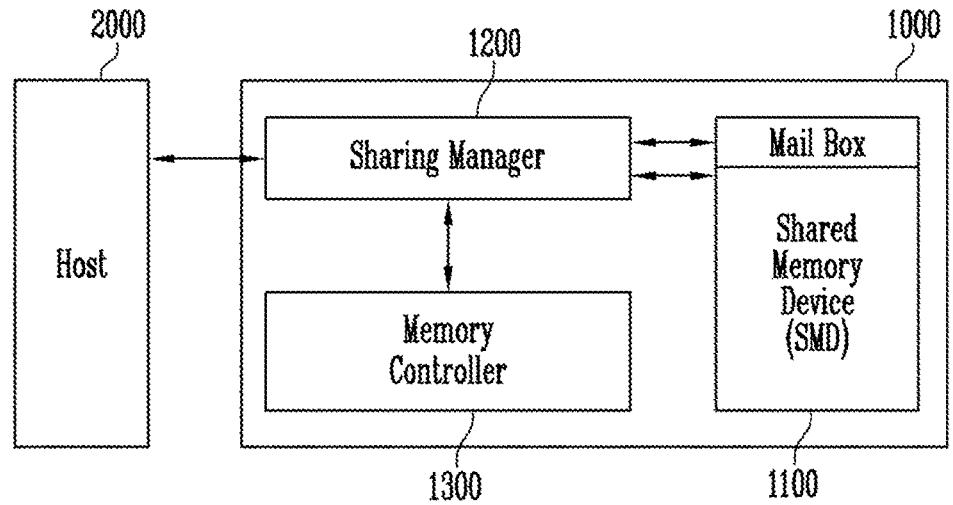
FIG. 11 shows a diagram illustrating a memory system according to another embodiment.

FIG. 11 shows a diagram illustrating a memory system according to another embodiment of the present disclosure.

Referring to FIG. 11, the mail box shown in FIG. 9 may be included in the sharing manager 1200. However, the mail box may also be included in the shared memory device SMD 1100. An auto mode may be managed using the mail box included in the shared memory device SMD 1100. In addition, to store a greater amount of various information, a mail box may be included in each of the sharing manager 1200 and the shared memory device SMD 1100, and information stored in each mail box may be used in the auto mode.

Figure 12:
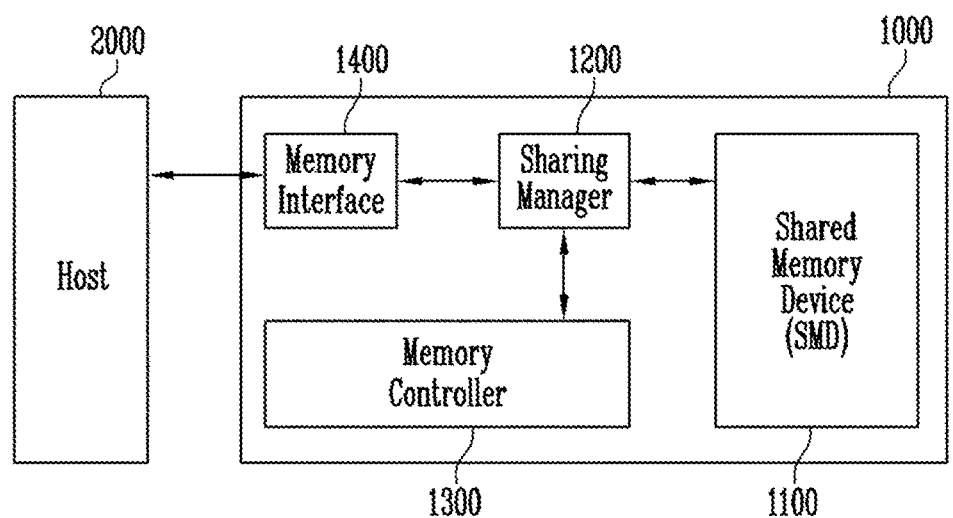
FIG. 12 shows a diagram illustrating a memory system according to another embodiment of the present disclosure.

FIG. 12 shows a diagram illustrating the memory system 1000 according to another embodiment of the present disclosure.

Referring to FIG. 12, the memory system 1000 may include a processing-in-memory (PIM). The PIM may autonomously perform some commands. The memory system 1000 including the PIM may include the shared memory device SMD 1100, the sharing manager 1200, the memory controller 1300, and a memory interface 1400. The shared memory device SMD 1100 may include a plurality of banks storing data. The sharing manager 1200 may determine a mode (manual mode or auto mode) of the memory system 1000, store and update information about the refresh policy, and generate a command. The memory controller 1300 may generate a command for performing a refresh operation in response to a command received from the sharing manager 1200. The memory interface 1400 may communicate a command, an address, and data between the host 2000 and the sharing manager 1200.

The memory system 1000 including the PIM may also perform the above-described refresh operation in the auto mode. To prevent a collision between refresh policies, the memory system 1000 may perform the refresh operation in the auto mode on the basis of the information about the refresh policy stored in the sharing manager 1200.

According to the present disclosure, a memory system may autonomously manage a shared memory device, so that a memory bandwidth bottleneck may be reduced. Accordingly, power consumption of the memory system using the shared memory device may be reduced, and performance of the memory system may be improved.

It will be apparent to those skilled in the art that various modifications can be made to the above-described embodiments without departing from the spirit or scope of the present teachings. Thus, it is intended that the present teachings cover all such modifications provided they come within the scope of the appended claims and their equivalents.

What is claimed is:

1. A memory system, comprising:
a shared memory device configured to store data;
a sharing manager configured to store operation policy information and configured to autonomously generate a first internal command by using the operation policy information during an auto mode started in response to receiving an auto mode start command from a host; and
a memory controller configured to generate a second internal command for controlling the shared memory device in response to the first internal command.

2. The memory system of claim 1, wherein the shared memory device comprises a plurality of banks.

3. The memory system of claim 2, wherein the banks comprise dynamic random access memory (DRAM) cells.

4. The memory system of claim 1, wherein the sharing manager comprises an ownership manager giving ownership to the host in a manual mode, when not in the auto mode, and allowing the sharing manager to have the ownership in the auto mode.

5. The memory system of claim 1, wherein the sharing manager comprises a management register configured to store the operation policy information.

6. The memory system of claim 5, wherein the management register stores tables used to manage the operation policy information, the tables comprising:
a type table to store information as to whether an operation policy is a per-bank policy or an all-bank policy;
a period table to store information about a period in which a request for a same operation transferred by the host is received;
a page table to store information about activated pages among pages included in the banks; and
a temperature table to store temperature information when a predetermined operation is performed on the banks.

7. The memory system of claim 1, wherein, in the auto mode, the sharing manager includes a signal for the auto mode in the first internal command when generating the first internal command.

8. The memory system of claim 1, wherein the memory controller comprises:
a mode detector configured to detect whether a current mode is a manual mode or the auto mode by detecting a signal for the auto mode included in the first internal command, and configured to output a mode signal according to a determination result; and
a processor configured to generate the second internal command for controlling the shared memory device in response to the mode signal and the first internal command.

9. The memory system of claim 1, wherein the sharing manager receives the second internal command from the memory controller and transfers the second internal command to the shared memory device.

10. The memory system of claim 1, wherein an auto mode ends when the sharing manager receives an auto mode end command from the host.

11. A memory system, comprising:
a shared memory device configured to store data;
a sharing manager configured to store operation policy information on a refresh operation, generate a first internal command at a request of a host in a manual mode, and autonomously generate the first internal command by using the operation policy information in an auto mode; and
a memory controller configured to generate a second internal command for performing the refresh operation of the shared memory device in response to the first internal command.

12. The memory system of claim 11, wherein the shared memory device comprises a plurality of banks.

13. The memory system of claim 12, wherein the banks comprise DRAM cells.

14. The memory system of claim 11, wherein the sharing manager comprises:
an address manager configured to store mapping information between an address included in a host command received from the host and addresses of banks included in the shared memory device;
an ownership manager configured to give ownership to the host in the manual mode and configured to allow the sharing manager to have ownership in the auto mode; and
a management register configured to monitor operations performed at a request of the host, store and update monitored information, and store operation policy information about the refresh operation.

15. The memory system of claim 14, wherein the management register stores:
a type table to store information as to whether a policy of the refresh operation is a per-bank policy or an all-bank policy;
a period table to store information about a period in which the refresh operation is performed at a request of the host;
a bank table to store address information about banks on which the refresh operation is performed when the policy of the refresh operation is the per-bank policy;
a page table to store information about activated pages among pages included in the banks; and
a temperature table to store temperature information when a predetermined operation is performed on the banks.

16. The memory system of claim 15, wherein a 'null' value is stored in the bank table when the policy of the refresh operation is the all-bank policy.

17. The memory system of claim 11, wherein the sharing manager generates the first internal command such that the memory controller generates the second internal command, and
wherein the memory controller generates the second internal command in response to the first internal command to control the shared memory device.

18. The memory system of claim 17, wherein, in the auto mode, the sharing manager includes a signal for the auto mode in the first internal command when generating the first internal command.

19. The memory system of claim 18, wherein the memory controller comprises:
a mode detector configured to detect whether a current mode is the manual mode or the auto mode by detecting the signal for the auto mode included in the first internal command, and configured to output a mode signal; and
a processor configured to generate the second internal command for controlling the shared memory device in response to the mode signal and the first internal command.

20. The memory system of claim 11, wherein the sharing manager ends the auto mode when an auto mode end command is received from the host.

21. A method of operating a memory system, the method comprising:
monitoring and storing operation policy information on a refresh operation performed at a request of a host;
allowing the memory system to have ownership in response to a request for an auto mode received from the host so that the memory system autonomously performs the refresh operation; and
performing the refresh operation on banks included in the shared memory device by using operation policy information for the refresh operation when the memory system has ownership.

22. The method of claim 21, wherein the refresh operation is maintained for an auto mode duration time set in the memory system, or is maintained until an end request is received from the host.

* * * * *